United States Patent [19]

Matsuura et al.

[11] E Patent Number: Re. 32,795

[45] Reissued Date of Patent: Dec. 6, 1988

[54] EXPOSURE APPARATUS FOR PRODUCTION OF INTEGRATED CIRCUIT

[75] Inventors: Toshio Matsuura, Koshigaya; Kyoichi Suwa, Kawasaki; Hisayuki Shimizu, Tokyo; Akikazu Tanimoto, Kawasaki, all of Japan

[73] Assignee: Nikon Corporation, Tokyo, Japan

[21] Appl. No.: 895,132

[22] Filed: Aug. 11, 1986

Related U.S. Patent Documents

Reissue of:

[64] Patent No.: 4,465,368
Issued: Aug. 14, 1984
Appl. No.: 335,733
Filed: Dec. 30, 1981

[30] Foreign Application Priority Data

Jan. 14, 1981 [JP] Japan ..... 56-4153

[51] Int. Cl.[4] ..... G01J 1/42; G03B 27/42

[52] U.S. Cl. ..... 356/121; 355/53; 355/68; 355/72; 356/218; 356/225

[58] Field of Search ..... 356/121, 124, 218, 223, 356/225, 226, 227, 375; 355/38, 68

[56] References Cited

U.S. PATENT DOCUMENTS

| | | | |
|---|---|---|---|
| 1,244,159 | 5/1916 | Adsit | 356/225 X |
| 3,100,429 | 8/1963 | Koch | 356/318 X |
| 3,867,036 | 2/1975 | Detwiler et al. | 356/121 |
| 4,205,918 | 6/1980 | Kisanuki et al. | 356/38 X |
| 4,320,462 | 3/1982 | Lund et al. | 356/121 |
| 4,345,836 | 8/1982 | Phillips | 355/77 |

OTHER PUBLICATIONS

Blum et al., "Beam Position and Intensity Analyzing Device", IBM Tech. Disc. Bulletin, vol. 12, #10, 3/1970, pp. 1594–1595, copy 356/121.

*Primary Examiner*—Vincent P. McGraw
*Attorney, Agent, or Firm*—Shapiro and Shapiro

[57] ABSTRACT

An exposure apparatus for production of ICs of the type that includes a stage on which is placed a semiconductor wafer to be exposed by illumination light projecting means, and means for two-dimensionally moving the stage within a plane intersecting the illumination light at substantially right angles. The improvement comprises illumination detection means provided with a photo reception surface, and means for mounting the illumination detection means on the stage in such a manner that the photo reception surface and the surface of the semiconductor wafer on the stage to be exposed are at substantially equal height relative to the stage.

28 Claims, 2 Drawing Sheets

EXPOSURE APPARATUS FOR PRODUCTION OF INTEGRATED CIRCUIT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to an exposure apparatus for production of integrated circuits (ICs) with an illuminometer for measuring intensity of illumination and/or distribution thereof on the water surface to be exposed by a light source.

2. Description of the Prior Art

The exposure apparatus for production of ICs of the type mentioned above is usually required to have high uniformity of illumination by which the wafer surface is to be exposed. In recent years, the degree of integration of ICs has become higher and higher up to the pattern line width of about 1 μm. With the increase of the integration degree of ICs, the requirement for uniformity of illumination has become more and more severe. The control on the pattern line width is directly affected by irregularity of the illumination. Irregularity of illumination results in irregularity of line width.

Conventionally, the intensity of illumination of the exposure apparatus is measured by an illuminometer. According to the prior art, the illuminometer is disposed in a space between the illumination light projection part (for example, the light projection part of a projection lens system) and the sample stage on which a wafer is placed. Also, to measure the distribution of intensity of illumination with the illuminometer, the illuminometer is mounted on a mounting table having a mechanism for moving the illuminometer one-dimensionally or two-dimensionally. With this prior art arrangement, the intensity of illumination or the distribution thereof actually measured is only that existing between the illumination light projection part and the stage, not the intensity of illumination directly on the part to be actually illuminated, that is, the exposed surface of the wafer on which a pattern is to be printed. This is one of the disadvantages of the prior art exposure apparatus.

To meet the increasing integration degree of ICs, the exposure apparatus recently developed are generally complicated in structure. Because of the complicated structure, some of these known apparatus have no space available for mounting the illuminometer with or without the above mentioned moving mechanism between the light projection part and the stage. In such cases, a characteristic test is carried out beforehand on the illumination system at the time of manufacture of the apparatus to know the intensity of illumination of distribution thereof on the portion to be illuminated by the illumination system. After the preliminary test, all of the components are assembled together into an exposure apparatus for production of ICs. However, since such a preliminary measurement is carried out at a position deviated or completely different from the position of a wafer in the finally completed apparatus, the data of intensity of illumination obtained therefrom are mere relative ones. It is impossible to correctly know the real intensity of illumination or distribution thereof on the exposed surface of any wafer actually placed on the stage at any point in time. This constitutes a second disadvantage of the prior art apparatus.

Furthermore, there is another problem in the prior art apparatus. The output of the lamp at the illumination light projection part decreases gradually with time. Conventionally, the deterioration of the lamp has been judged on the basis of only the lit time thereof. When the lamp has been used for illumination for a certain predetermined time, one judges this to be the end of the life of the lamp. In other words, replacement of the old lamp has conventionally been done based on a mere rough estimate of the useful life of the lamp. Obviously, this method is subject to errors.

SUMMARY OF THE INVENTION

Accordingly, it is an object of the invention to provide an exposure apparatus for production of ICs which enables measurements of the real intensity of illumination and distribution thereof on the exposed surface of a wafer in a very simple manner and at any desired points in time.

It is another object of the invention to provide an exposure apparatus for production of ICs which enables correct judgment of the deterioration of the lamp of the illumination light projection part at any time.

To attain the above and other objects according to the invention there is provided such exposure apparatus for production of ICs which is provided with illumination detecting means mounted on the stage.

Other and further objects, features and advantages of the invention will appear more fully from the following description taken in connection with the accompanying drawings.

DETAILED DESCRIPTION OF PREFERRED EMBODIMENTS

Figure 1:
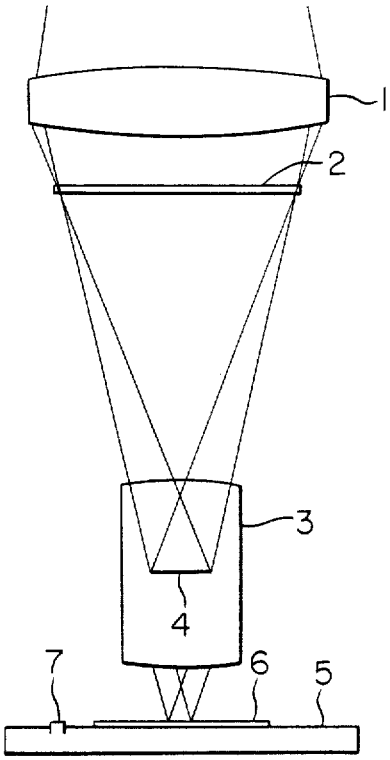
FIG. 1 is a side view of an embodiment of the present invention.

Referring first to FIG. 1 there is shown an embodiment of the invention formed as a minifying projection exposure apparatus for production of ICs.

Designated by 1 is a condenser lens 1. An IC pattern is on a reticle 2. 3 is a minifying projection lens whose pupil is designated by 4. A stage 5 on which a wafer 6 is placed is movable two-dimensionally. By the illumination light passed through the condenser lens 1, a minified image of an IC pattern on the reticle 2 is projected on the wafer 6 positioned on the stage 5. Thus, the wafer 6 is exposed to the IC pattern on the reticle 2. An illuminometer 7 is embedded in the stage 5. This illuminometer 7 is composed of a photoelectric transducer element such as photo diode.

Figure 2:
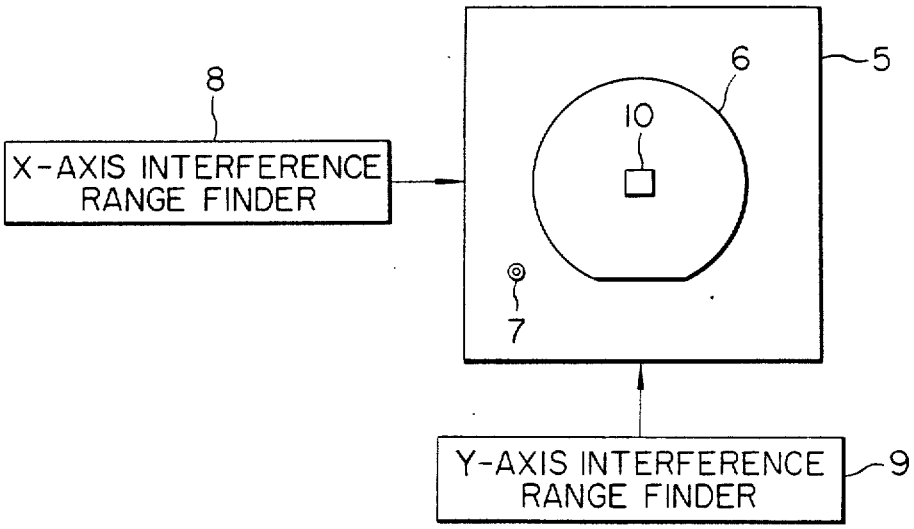
FIG. 2 is a plan view of the stage of the apparatus shown in FIG. 1.

FIG. 2 is a plan view of the stage 5 as seen from above. The stage 5 can be moved in two-dimensional directions in a plane including the stage surface by means of an X-Y moving mechanism not shown. The two-dimensional position of the stage 5 can be determined in the order of a unit of about 0.02 μm by an X-axis interference range finder 8 and a Y-axis interference range finder 9. The information as to stage position obtained by the range finders 8 and 9 may be used to program control the amount of movement of the stage 5 employing a computer (not shown). In the embodiment shown, the maximum size of the area 10 to be illuminated is in the order of 10 mm×10 mm.

Figure 3:
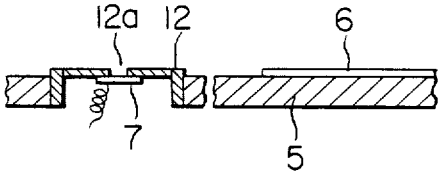
FIG. 3 is an enlarged sectional view of the essential part of the apparatus shown in FIG. 1.

FIG. 3 is an enlarged sectional side view of the illuminometer 7, wafer 6 and stage 5. As seen in FIG. 3, a cap-shaped supporting and masking member 12 is embedded in the stage 5. Within the supporting member 12, the illuminometer 7 is fixed on the inside of the supporting member with its photo reception surface upward. Relative to the wafer supporting surface of the stage 5, the photo reception surface of the illuminometer 7 is maintained at a level substantially equal to the exposed surface of the wafer 6. The supporting and masking member 12 is formed of a material which intercepts the illumination light. But, the supporting member has a pin hole 12a in its top wall small (in order of 0.5 mm in diameter) relative to the area of the photo reception surface of the illuminometer 7 to allow only a limited very small area of the photo reception surface of the illuminometer 7 to be exposed to the illumination light as shown in FIG. 3. The illuminometer 7 converts the light passed through the pin hole 12a into an electric signal whereby the intensity of illumination is measured.

To measure the distribution of illumination, at first the stage 5 is moved up to the position at which the pin hole 12a falls within the area 10 to be illuminated. Thereafter, the stage 5 is moved two-dimensionally in such a manner as to scan the pin hole 12a in the illuminated area 10 while measuring the position of the stage 5 at any time by means of the range finders 8 and 9. Thus, the illumination distribution in the illuminated area 10 can be found from the illumination data obtained by the illuminometer 7 and the corresponding position data obtained by the range finders 8 and 9.

Figure 4:
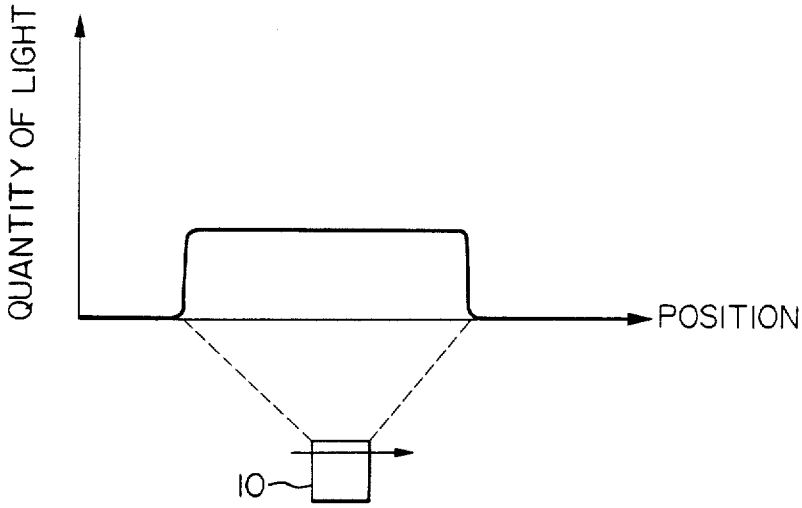
FIG. 4 is a graph showing the distribution of intensity of illumination attained by the apparatus.

FIG. 4 shows, by way of example, one-dimensional distribution of intensity of illumination as obtained when the illuminometer 7 was one-dimensionally moved in the direction of the arrow within the illuminated area 10. It is obvious that, similarly, two-dimensional distribution of illumination can be found by moving the stage 5 two-dimensionally.

Instead of using interference range finders shown in the above embodiment, other measuring means for obtaining position data, such as linear scale, may be used.

Since the function of the pin hole 12a is to limit the light receivable area of the illuminometer 7 to a very minute area, the resolving power for measuring the distribution of intensity of illumination, that is, the size of the small opening 12a relative to the size of the illuminated area 10 may be suitably selected as desired. The form of the necessary small opening is not limited to a pin hole as shown in the above embodiment. A small opening in the form of a slit having a very small width also may be used for this purpose.

In the above described type of exposure and printing apparatus it is a common practice in the art to control the respective operations of the apparatus by using a computer. Therefore, it is recommended that a program for measuring the illumination distribution be incorporated into the sequential control program of the apparatus. By doing so, it is possible to automatically measure the intensity of illumination and illumination distribution on an exposed surface during the operation of the exposure and printing apparatus at a suitable operation step (for example at the step of wafer replacement). Also, it is possible to know the change of illumination distribution with time. In addition, by moving the stage 5 in such a manner as to move the illuminometer 7 along a diagonal line of the illuminated area 10, there can also be obtained data as to the uniformity of illumination light on the area 10. Such data are obtainable simultaneously with measuring the illumination distribution through a computer processing of the obtained illumination distribution.

The illuminometer may be used also to ascertain the real exposure area of the reticle. To this end, the illuminometer 7 is moved to detect the rise and fall of the illumination distribution characteristic. Since the position of the stage 5 at the rise and that at the fall can be determined by the range finders 8 and 9, the real size of the illuminated area, that is, the size of the real pattern printing area, can be measured in a simple manner. This measurement of the real pattern printing area size is of significance in particular when the effective area of the reticle is very small and the illuminated area on a wafer becomes smaller than the square of 10 mm×10 mm. In this case, a mask is usually used to cover the surrounding area of the reticle against light, leaving only the pattern area of the reticle exposed. The above measurement of the real pattern area size is a very effective method to ascertain whether or not the surrounding area of the reticle is completely covered by an intercepting frame against the illumination light, the frame being designed in such a manner as to open only a pattern area of the reticle.

Figure 5A:
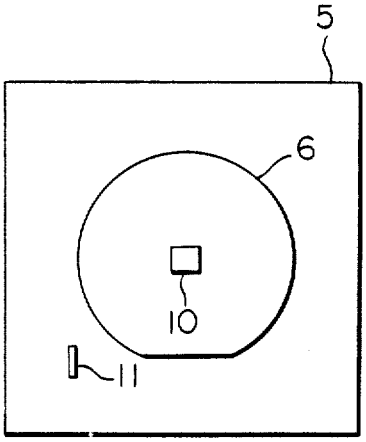
FIG. 5A is a plan view of a stage showing another embodiment of the invention.
Figure 5B:
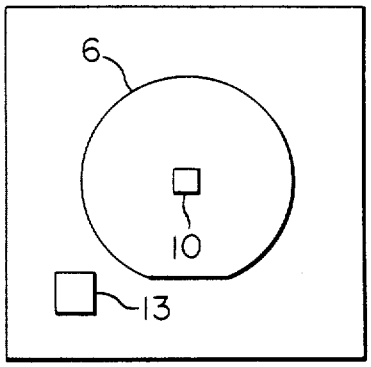
FIG. 5B is a plan view of a stage showing a further embodiment of the invention.

Obviously many modifications and variations of the present invention are possible in view of the above teachings. The illuminometer shown in the above embodiment may be replaced by other illumination detecting means. FIGS. 5A and 5B show other forms of illumination detecting means used in the invention. Illumination detecting means shown in FIG. 5A is formed as a one-dimensional photo sensor 11. The photo sensor 11 is composed of a number of elements such as photo diodes arranged in a row in a one-dimensional direction. With this one-dimensional photo sensor 11, the intensity of illumination can be measured by moving the stage 5 only in one direction intersecting, at a right angle, the, length of the photo sensor 11.

Illumination detection means shown in FIG. 5B is formed as a two-dimensional photo sensor 13 which is composed of a number of elements such as photo diodes arranged two-dimensionally. With this photo sensor 13, the characteristic of illumination distribution can be found merely by electrically scanning the photo sensor 13 after moving the stage 5 up to the position at which the photo sensor 13 falls within the illuminated area 10.

As for exposure, various types of rays may be used, such as visible light, ultraviolet light and soft X-rays. The illuminometer and the intercepting member in the present invention should be selected suitably according to the wavelength of the rays to be detected.

We claim:

1. In an exposure apparatus for production of integrated circuits including a stage on which a semiconductor wafer is placed for exposure by illumination light projecting means and means for two-dimensionally displacing said stage in a plane intersecting the illumination light at substantially right angles, an improvement comprising:

illumination detecting means having a photo reception surface; and means for *fixedly* mounting said illumination detecting means on said stage in such manner that said photo reception surface lies substantially at the same level as the exposed surface of said semiconductor wafer on said stage relative to said stage.

2. The improvement as set forth in claim 1, wherein said illumination light projecting means is so mounted as to illuminate a selected area on said stage and wherein said illumination detecting means is mounted out of said selected area on said stage.

3. The improvement as set forth in claim 2 which further comprises means for guiding said illumination detecting means into said selected area.

4. The improvement as set forth in claim 3, wherein said displacing means includes means for detecting the position of said illumination detecting means and means for driving said stage in response to said position detecting means.

5. The improvement as set forth in claim 1, wherein said mounting means includes an intercepting member having an opening therethrough that is very small in area parallel to said plane relative to the area of the photo reception surface parallel to said plane to limit the light receivable area on the photo reception surface of said illumination detecting means.

6. The improvement as set forth in claim 1, wherein said illumination detecting means comprises a one-dimensional photo sensor.

7. The improvement as set forth in claim 1, wherein said illumination detecting means comprises a two-dimensional photo sensor.

8. In an exposure apparatus for production of integrated circuits in which a pattern is illuminated to print an image of the pattern through an optical system onto a surface to be exposed of a semiconductor wafer having predetermined thickness, an improvement comprising:

(a) a stage having a surface for supporting said semiconductor wafer thereon at a predetermined location with said semiconductor wafer surface to be exposed oriented substantially perpendicular to the optical axis of said optical system, the stage being supported to move on a two-dimensional plane substantially orthogonal to said optical axis;

(b) limiting means providing a limited area through which light passes, said limiting means being integral with said stage and positioned at a location on said stage spaced laterally away from said predetermined location;

(c) means detecting the light which passes through said limiting means to convert it into an electric signal, said detecting means *being fixedly mounted on said stage and* having a photo reception surface that is at substantially the same level relative to said stage surface as the surface of the semiconductor wafer to be exposed; and (d) means for detecting the position of said stage on said two-dimensional plane.

9. In an exposure apparatus for production of integrated circuits in which a pattern is illuminated to print an image of the pattern through an optical system onto a surface to be exposed of a semiconductor wafer, an improvement comprising:

(a) a stage on which said semiconductor wafer is supported with said semiconductor wafer surface to be exposed substantially perpendicular to the optical axis of said optical system, the stage being supported to move on a two-dimensional plane substantially orthogonal to said optical axis;

(b) illumination detecting means having a photo reception surface and being provided with an intercepting member having an opening formed therethrough that is very small in area parallel to said plane relative to the area of the photo reception surface parallel to said plane to limit the light receivable area on the photo reception surface, the illumination detecting means including means to support said photo reception surface *fixedly* on said stage at a level substantially coincident with the level of said semiconductor wafer surface to be exposed; and (c) means detecting the position of said stage on said two-dimensional plane.

10. The improvement as set forth in claim 9, wherein said illumination detecting means includes a photoelectric element for detecting the light which passes through said opening to convert it into an electric signal.

*11. The improvement as set forth in claim 1, wherein said illumination detecting means is embedded in said stage.*

*12. The improvement as set forth in claim 8, wherein said detecting means is embedded in said stage.*

*13. The improvement as set forth in claim 9, wherein said illumination detecting means is embedded in said stage.*

*14. An exposure apparatus for production of integrated circuits comprising:*

*(a) illuminating means for illuminating a reticle;*

*(b) a stage provided with a supporting surface for supporting a wafer on said supporting surface;*

*(c) moving means for moving said stage on a two-dimensional plane which is parallel to a surface to be exposed of said wafer;*

*(d) position detecting means for detecting the position of said stage on said two-dimensional plane;*

*(e) illumination light detecting means having a detection surface; and*

*(f) mounting means for mounting said illumination light detecting means fixedly on said stage so that said detection surface is substantially at the same level as said surface of the wafer and said illumination light detecting means is out of an area of said stage where said wafer is disposed.*

*15. An apparatus according to claim 14, wherein said light detecting means is embedded in said stage.*

*16. An exposure apparatus for production of integrated circuits comprising:*

*(a) illuminating means for illuminating a reticle, said illuminating means having an optical system for forming a minified image of the illuminated reticle on a predetermined plane so that the size of said image of said reticle is smaller than the size of said reticle;*

*(b) a stage provided with a supporting surface for supporting a wafer on said supporting surface so that a surface to be exposed of said wafer is substantially at the same level as said predetermined plane;*

*(c) moving means for moving said stage on a two-dimensional plane which is parallel to said predetermined plane;*

(d) position detecting means for detecting the position of said stage on said two-dimensional plane;

(e) light detecting means having a detection surface, said detecting means detecting an intensity of light incident on said detection surface to produce an electric signal conforming to the detected intensity; and (f) mounting means for mounting said light detecting means fixedly on said stage so that said detection surface is substantially at the same level as said predetermined plane and said detecting means is out of an area of said stage where said wafer is disposed.

17. An apparatus according to claim 16, wherein said light detecting means has a photoelectric conversion element and a light intercepting member provided with an opening, and said photoelectric conversion element is attached to said light intercepting member so that said photoelectric conversion element detects light from said illuminating means through said opening.

18. An apparatus according to claim 17, wherein said stage has the shape of a rectangle and said light detecting means is disposed adjacent to one of the corners of said rectangle.

19. An apparatus according to claim 17, wherein said position detecting means has two interference range finders which measure a position of said stage in two directions which are perpendicular to each other.

20. An apparatus according to claim 16, wherein said light detecting means is embedded in said stage.

21. An exposure apparatus for production of integrated circuits comprising:

(a) illuminating means for illuminating a reticle, said illuminating means having an optical system for forming a minified image of the illuminated reticle on a predetermined plane so that the size of said image of said reticle is smaller than the size of said reticle;

(b) a stage for supporting a wafer thereon so that a surface to be exposed of said wafer is substantially at the same level as said predetermined plane;

(c) moving means for moving said stage on a two-dimensional plane which is parallel to said predetermined plane; and (d) measuring means for detecting positions of rise and fall of an illumination distribution of the image of said illuminated reticle on said predetermined plane to measure the size of an exposure area corresponding to the image of the illuminated reticle, said measuring means including light detecting means, mounting means for mounting said light detecting means fixedly on said stage, and position detecting means for detecting each of the positions of said stage on said two-dimensional plane, said light detecting means having a detection surface and detecting an intensity of light incident on said detection surface to produce an electric signal conforming to the detected intensity, said mounting means mounting said light detecting means so that said detection surface is substantially at the same level as said predetermined plane and said detecting means is out of an area of said stage where said wafer is disposed.

22. An apparatus according to claim 21, wherein said light detecting means has a photoelectric conversion element and a light intercepting member provided with an opening, and said photoelectric conversion element is attached to said light intercepting member so that said photoelectric conversion element detects light from said illuminating means through said opening.

23. An apparatus according to claim 22, wherein said stage has the shape of a rectangle and said light detecting means is mounted adjacent to one of the corners of said rectangle.

24. An apparatus according to claim 21, wherein said light detecting means is embedded in said stage.

25. An exposure apparatus for production of integrated circuits comprising:

(a) illuminating means for illuminating a reticle, said illuminating means having an optical system for forming a minified image of the illuminated reticle on a predetermined plane so that the size of said image of said reticle is smaller than the size of said reticle;

(b) a stage provided with a supporting surface for supporting a wafer on said supporting surface so that a surface to be exposed of said wafer is substantially at the same level as said predetermined plane;

(c) moving means for moving said stage on a two-dimensional plane which is parallel to said predetermined plane;

(d) position detecting means for detecting the position of said stage on said two-dimensional plane;

(e) light detecting means having a detection surface, said detecting means detecting an intensity of light incident on said detection surface to produce an electric signal conforming to the detected intensity; and (f) mounting means for mounting said light detecting means fixedly on said stage so that said detection surface is substantially at the same level as said predetermined plane.

26. An apparatus according to claim 25, wherein said light detecting means is embedded in said stage.

27. An exposure apparatus for production of integrated circuits comprising:

(a) illuminating means for illuminating a reticle, said illuminating means having an optical system for forming a minified image of the illuminated reticle on a predetermined plane so that the size of said image of said reticle is smaller than the size of said reticle;

(b) a stage for supporting a wafer thereon so that a surface to be exposed of said wafer is substantially at the same level as said predetermined plane;

(c) moving means for moving said stage on a two-dimensional plane which is parallel to said prerdetermined plane; and (d) measuring means for detecting positions of rise and fall of an illumination distribution image of the illuminated reticle on said predetermined plane to measure the size of an exposure area corresponding to the image of said illuminated reticle, said measuring means including light detecting means, mounting means for mounting said light detecting means fixedly on said stage, and position detecting means for detecting each of the positions of said stage on said two-dimensional plane, said light detecting means having a detection surface and detecting an intensity of light incident on said detection surface to produce an electric signal conforming to the detected intensity, said mounting means mounting said light detecting means so that said detection surface is substantially at the same level as said predetermined plane.

28. An apparatus according to claim 27, wherein said light detecting means is embedded in said stage.

* * * * *